United States Patent [19]

Reenstra

[11] Patent Number: 4,492,920
[45] Date of Patent: Jan. 8, 1985

[54] ELECTRIC INDICATOR WITH RETURN-TO-ZERO FEATURE AND COMPENSATING COIL TO CANCEL THE RETURN-TO-ZERO FEATURE DURING MEASUREMENT

[75] Inventor: Arthur L. Reenstra, New Hope, Pa.

[73] Assignee: Beede Electrical Instrument Co., Inc., Penacook, N.H.

[21] Appl. No.: 275,977

[22] Filed: Jun. 22, 1981

[51] Int. Cl.³ .............................................. G01R 1/20
[52] U.S. Cl. ................................................... 324/146
[58] Field of Search ....................... 324/146, 150, 152

[56] References Cited

U.S. PATENT DOCUMENTS

| 3,460,038 | 8/1969 | Ziegler | 324/146 |
| 3,636,447 | 1/1972 | Gelenius | 324/146 |
| 4,197,494 | 4/1980 | Van De Werken | 324/146 |

Primary Examiner—Gerard R. Strecker
Assistant Examiner—Walter E. Snow
Attorney, Agent, or Firm—Weingarten, Schurgin, Gagnebin & Hayes

[57] ABSTRACT

An air core meter movement having return-to-zero means. Permanent magnets mounted within the deflection coils provide a field which interacts with the rotor magnet to return the pointer to zero when no power is applied to the meter. A compensating coil is also included to counteract the effects of the permanent magnets when measurable signals are applied to the deflection coils.

14 Claims, 8 Drawing Figures

ELECTRIC INDICATOR WITH
RETURN-TO-ZERO FEATURE AND
COMPENSATING COIL TO CANCEL THE
RETURN-TO-ZERO FEATURE DURING
MEASUREMENT

FIELD OF THE INVENTION

This invention relates generally to electrical indicators, and more particularly to an air core meter movement having a means for returning the pointer to the zero position when power is disconnected from the meter movement.

BACKGROUND OF THE INVENTION

In electrical indicators, often classified as analog devices such as volt meters, ammeters, and other dial and pointer-type instruments, it has been necessary to address the problems associated with returning the pointer to zero when no power is applied to the meter. Over the course of many years attempts have been made to provide this function by a variety of means, including electrical, mechanical, magnetic, or combinations thereof. In some types of meter movements, it is relatively easy to provide means to return the pointer to zero. However, in air core or vector movement meters where springs are not used, when the electrical power is turned off, the pointer does not automatically return to zero, but it will normally remain in the position it was when the power was turned off. On the other hand, the pointer may come to rest at some arbitrary position unrelated to the reading at the time the power is disconnected. In some instances, the fact that the meter does not return to zero is a cosmetic problem and more a matter of choice than a matter of necessity. However, in some applications there could be a direct relationship between safety and the reading of a meter with no power applied. For example, in aircraft, if there is a loss of electrical power to an instrument, the fact that it does not return to zero can result in the operator's perceiving a false reading and thereby reacting improperly to a situation where he does not have accurate information.

Air core meter movements have replaced the D'Arsonval movements, which were the standard for analog meters for many years, in many automotive uses. This is because the air core movement is more rugged than the D'Arsonval movement, the air core movement has no springs, and the torque applied to it is high enough so that the bearing arrangement may be formed as a rugged throughshaft system as opposed to employing jeweled bearings. An air core instrument employing coils which generate orthogonal magnetic fields for purposes of deflecting the movement rotor is shown in U.S. Pat. No. 3,168,689. Another aspect of air core meters is shown in U.S. Pat. No. 3,460,038. These patents describe the structure and operation of a basic air core meter, the type of meter which is the subject of the present invention.

Examples of patents which disclose particular means for providing a return-to-zero function, and patents which disclose the use of auxiliary permanent magnets within the meter movement for some purpose are listed below.

U.S. Pat. No. 3,777,265 employs magnets for the zero or restoring force, and an external electrical current is employed to provide the field for deflecting the meter pointer.

U.S. Pat. No. 3,995,214 employs magnets for biasing and compensating only for purposes of improving the linearity of the meter response to input signals.

Another example of a patent which employs a stationary permanent magnet to provide return torque is U.S. Pat. No. 4,090,131. In this patent, the magnetic field of the permanent magnet interacts with the rotor flux to provide a return torque which varies linearly with the rotor angle.

Other patents which disclose the use of permanent magnets for zeroing the meter movement are U.S. Pat. Nos. 2,668,945 and 3,094,659.

SUMMARY OF THE INVENTION

It is an object of the present invention to provide a simple return-to-zero means in an air core meter. It is another object to provide the return-to-zero function together with compensation means which obviates the effects of the return-to-zero means when a signal to be indicated is applied to the meter. With this compensation means, the influence of the return-to-zero function applies to the meter rotor only when power is removed from the instrument.

Broadly speaking, this invention is concerned with an air core meter having the normal orthogonally positioned deflection coils to position the rotor in response to input signals which are proportional to a quantity being measured. That quantity may be primarily voltage or current, but it is normally directly proportional to various physical phenomena such as level, speed, temperature, and the like. More specifically, this invention employs two permanent magnets located on either side of the bobbin or frame in which the rotor is mounted, thereby providing a field which, when no other deflection forces are applied to the rotor, returns the rotor to a preset or zero position. Wound directly about the bobbin is a compensating coil which applies an oppositely directed field to the rotor to cancel the effects of the field provided by the permanent magnets. This compensating coil operates whenever power is applied to the meter, whether or not a measurable signal is also applied simultaneously. The orthogonally wound deflection coils, commonly called sine and cosine coils, are then wound about the bobbin in a known manner.

A major advantage of the present invention is that the return-to-zero function, together with a means to cancel that function during normal indicating operation of the meter, are added in a very simple manner to a conventional air core meter movement without in any way affecting the normal indicating function of the meter. An additional advantage is that the return-to-zero device and the compensation means may be designed so that changes in the magnetic field strength of the permanent return-to-zero magnets resulting from ambient temperature changes are balanced by changes in thermal conductivity of the compensation coil windings.

BRIEF DESCRIPTION OF THE DRAWINGS

The objects, advantages, and features of this invention will be more clearly understood from the following detailed description when read together with the accompanying drawing, in which.

DETAILED DESCRIPTION OF THE PREFERRED EMBODIMENT

Figure 1:
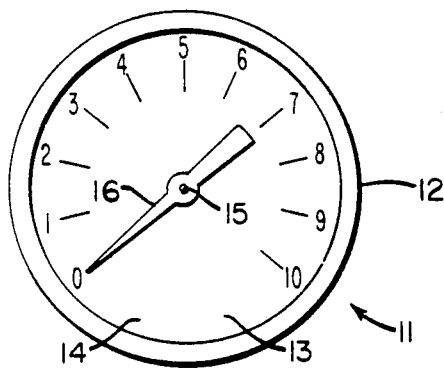
FIG. 1 is a front view of a meter in the form of a tachometer in which the present invention is incorporated.

With reference now to the drawing and more particularly to FIG. 1 thereof, there is shown a meter, in the form of a tachometer, generally referred to by the reference numeral 11. Within the bezel 12 is normally a protective glass 13 beneath which is indicating face 14. A shaft 15 projects through the center of the indicating face, and pointer 16 is mounted thereon. In the position shown in FIG. 1, pointer 16 is aligned with the "0" indication. Furthermore, the meter of FIG. 1 is shown as a 270° meter. This invention functions effectively as part of any meter for which an air core movement is applicable. Such meters normally have movements ranging between 90° and 270°, but air core movements may be made which have larger or smaller arcuate scales.

Figure 2:
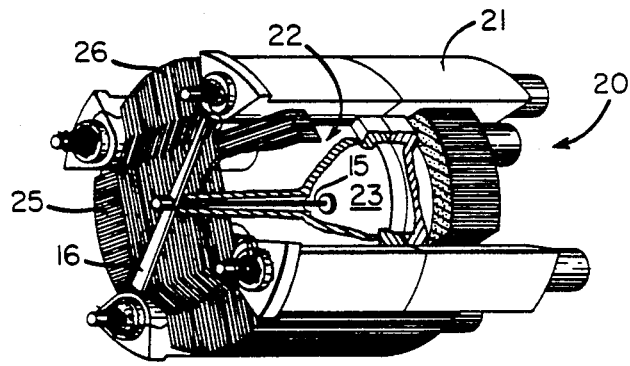
FIG. 2 is a perspective view of the movement of an air core meter of the type employed in this invention.

A completed meter movement 20, before mounting in the meter case, is shown in FIG. 2. The main supporting frame of the meter movement is bobbin 21 which includes a housing cavity 22 within which is rotatably mounted rotor 23. The rotor is preferably made of a permanent magnetic material and is magnetized with distinct diametric or radially opposite north and south magnetic poles. An example of such material which can be employed in an air core meter is referred to by the name "Lodex" (a trade name of General Electric Company). The housing provides a sealed environment for the rotor. It is normally desirable to provide some type of damping means for the rotor. A damping fluid such as a silicone may be put into cavity 22, or a more viscous substance such as grease may be used in the meter bearings in such a manner as to surround the rotor shaft at either or both ends. The shaft 15 is mounted to the rotor, and the bobbin provides journal bearings for either end of the shaft in known manner. Pointer 16 is mounted to one end of shaft 15. In final assembly, of course, the dial face 14 would be positioned on the meter movement beneath pointer 16. Wound about bobbin 21 is inner or cosine coil 25 and outer or sine coil 26. Note that these deflection coils are orthogonally wound around the bobbin. In this manner, coils 25, 26 provide orthogonal electromagnetic fields. The fluxes produced by the deflection coils are mutually perpendicular and intersect at a point in the center of the windings. The structure of the meter movement is such that this intersection point is on the movement (and shaft) axis and at the center of rotor 23. Additionally, the axes of the fluxes lie in the plane of the center of the rotor 23. The basic functioning of the meter movement disclosed in FIG. 2 is adequately described in previously mentioned U.S. Pat. No. 3,168,689 and is well known in the art. Therefore, a detailed description of the meter movement itself will not be set forth herein.

Figure 3:
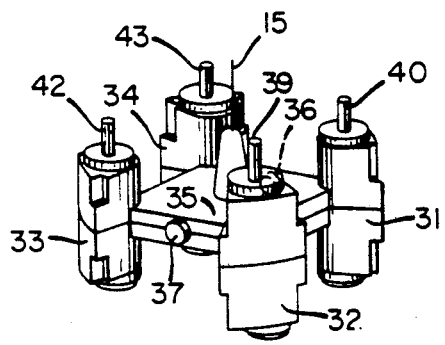
FIG. 3 is a perspective view of the bobbin used in the movement of FIG. 2 showing the location of the return-to-zero magnets.

FIG. 3 shows the bobbin of the meter movement at a preliminary stage of assembly. The bobbin itself is made of a relatively inexpensive, non-conductive and non-magnetic material such as an appropriately rigid plastic. The bobbin is formed with corner posts 31, 32, 33, and 34 and housing section 35 which interconnects the four corner posts and provides the housing cavity 22 discussed previously. Small recesses 36 are formed in housing 35 on diametrically opposite sides thereof, in a horizontal plane which passes through the center of the housing cavity and consequently through rotor 23, as viewed in FIG. 3. In these recesses are secured small discs 37 which are each a permanently magnetized ferrite. A material which is satisfactory for these magnets is sold under the tradename "Plastiform," owned by Leyman Corporation. These ferrite discs, when subjected to an appropriate magnet field, become strong permanent magnets and as mounted form the return-to-zero magnets of the meter of the present invention. The return-to-zero permanent magnets may be of any shape or form, and are arranged, as for example NS—NS or SN—SN (as viewed on a line through these magnets which intersects the axis of rotor 23) to establish the restoring return-to-zero magnetic field. It is only necessary that they function together with the magnetic poles of the rotor to urge the rotor to a preset position. These magnets may be shaped other than as discs, they may be small groupings of magnetic elements instead of single magnets 37, or they may even be formed integrally with the bobbin.

Figure 4:
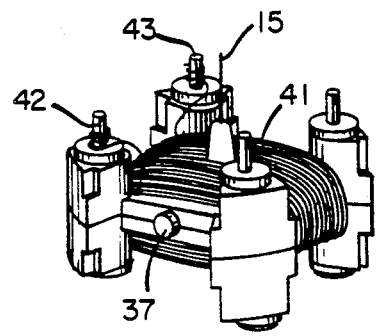
FIG. 4 is a view similar to FIG. 3 showing the compensating coil wound on the bobbin.

A compensating coil 41 is then wound around housing 35 (FIG. 4) in a manner such that, when current is passed therethrough, the field produced by the coil will be on the same axis as that produced by magnets 37, but in the opposite direction. The ends of the compensating coil wire are connected to terminals 42 and 43 on respective corner posts 33 and 34. For reference purposes, the wires of the compensating coil are wound on the bobbin with the same physical orientation as the cosine deflecting coil. The cosine coil comprises an appropriate multiplicity of turns of copper wire wound over the top of the compensating coil, the ends of the cosine coil being connected to terminals 40 and 43 on respective corner posts 31 and 34. The sine coil, also comprising an appropriate multiplicity of turns of copper wire, is then wound on the bobbin, the turns being physically oriented orthogonally with respect to the cosine coil. Because one coil is closer to the rotor than the other, the number of turns of the sine coil may differ somewhat from the number of turns of the cosine coil. The sine coil wire is connected to terminals 39 and 43 on respective corner posts 32 and 34. The completed device is shown in FIG. 2, where permanent magnets 37 are enclosed within the sine and cosine coils and are spaced on housing 35 by 180°. These magnets are oriented physically on the center line of the sine coil winding, that is, the turns of wire of the sine coil cover magnets 37, whereas the cosine coil turns left the magnets exposed on the sides of the housing.

The meter movement of this invention is shown and described as having the coils wound on the bobbin in the order of compensating, cosine, and sine coils. However, it is quite feasible to wind the coils in any order. It is also possible that the sine coil could be wound in alignment with the compensating coil instead of orthogonally with respect to it. Such variations in structure do not affect the function of the invention.

Figure 5:
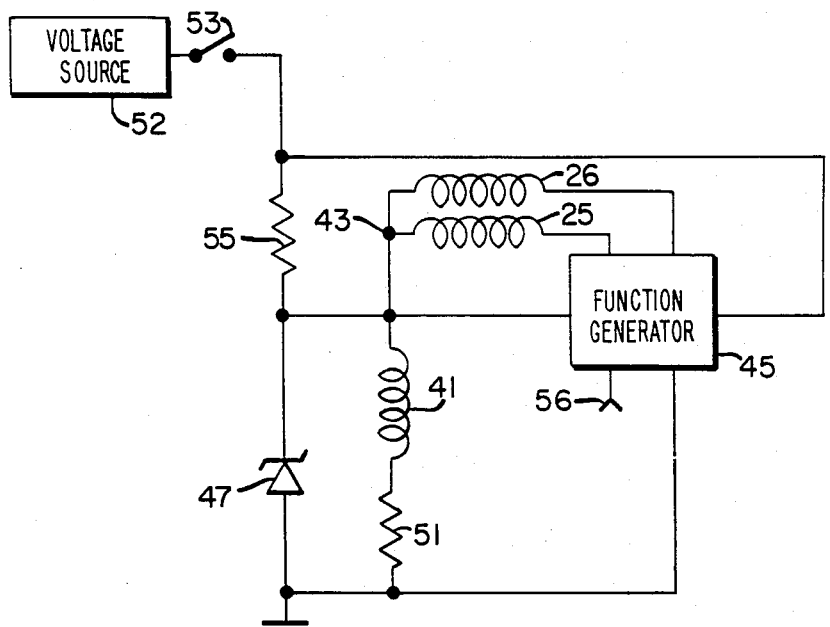
FIG. 5 is a simplified schematic diagram of the meter circuit of the invention including the compensating coil.

FIG. 5 schematically shows the operating circuitry of the meter of this invention. A function generator 45 may be any device which provides the signals to the coils which are indicative of a phenomenon to be measured. As indicated previously, this could very well be speed or revolutions per minute, and the instrument would then be a tachometer. Cosine coil 25 and sine coil 26 are connected to signal source 45 and have a common terminal 43. Terminal 43 provides a common or reference voltage in the instrument circuit. The object of Zener diode 47 is to maintain, together with resistor 55, a substantially constant voltage on common terminal 43, that is, a reference voltage. Compensating coil 41 is connected between reference voltage terminal 43 and ground through resistor 51. DC voltage source 52, which may be the battery of an automobile, is connected to the compensating coil through switch 53 and resistor 55. Thus, it is immediately evident that when switch 53, which may be the ignition switch of the automobile, is closed, a bias voltage is applied to compensating coil 41 for purposes to be further described below, and to common terminal 43 to provide the circuit reference voltage. Function generally 45 may be an integrated circuit (IC) device and may have several functions normal in such an instrument which do not relate to the present invention. Therefore, the function generator will not be described in detail beyond stating that it provides the necessary signals in a known manner to cosine and sine coils 25, 26, pursuant to signals applied thereto by means of external signal source 56. A voltage of sufficient magnitude is readily available in an automobile to provide the power necessary for operating the instrument represented by FIG. 5.

Figure 6:
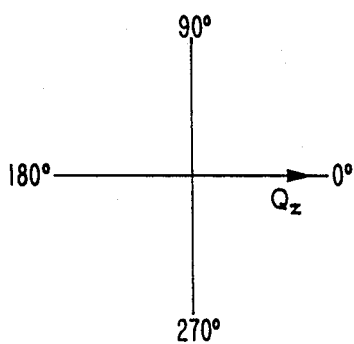
FIG. 6 is a vector diagram showing the effect of the return-to-zero magnets when the power to the meter is off.
Figure 7:
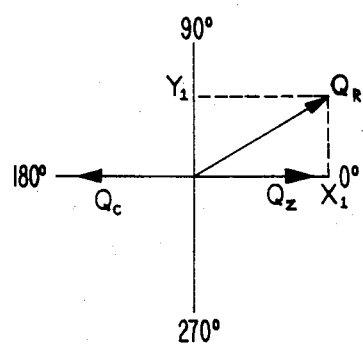
FIG. 7 is a vector diagram showing the effects of applying power and a signal to the meter.
Figure 8:
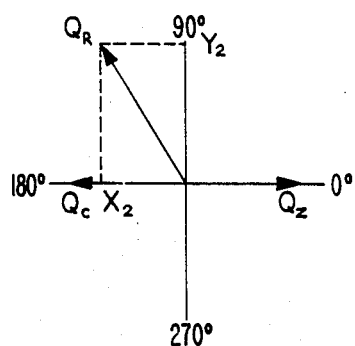
FIG. 8 is a vector diagram similar to FIG. 7 showing the effect of a different signal applied to the meter.

The effect of the return-to-zero magnets and the meter coils will now be explored in greater detail with reference to FIGS. 6–8, which are vector diagrams representing the various forces which may be applied to the meter movement rotor. When the meter is in the quiescent condition, that is, when switch 53 is open and no power is applied to the meter, FIG. 6 is applicable. As stated previously, return-to-zero magnets 37 have a flux or magnetic field axis such that the rotor is urged to a position of rest, which may be defined as the zero position of pointer 16. The flux of magnets 37 is represented by vector $Q_Z$ on the zero axis in FIG. 6. No other magnetic or electromagnetic fluxes are applied to the rotor when switch 53 is open.

In FIG. 7 it is assumed that switch 53 is closed and that a signal is supplied to the deflection coils by means of function generator 45 pursuant to a signal from external input 56. When switch 53 is closed, compensating coil 41 provides a field or flux $Q_C$ which is equal and opposite in direction to field or flux $Q_Z$ produced by magnets 37. Thus, it may be seen that as soon as the switch is closed and power from voltage source 52 is applied to the meter movement, the effect of return-to-zero magnets 37 is removed from the meter rotor. In FIG. 7 a signal is applied to cosine coil 25 of magnitude $X_1$ and to sine coil 26 of magnitude $Y_1$, thereby having a resultant flux direction and magnitude indicated by vector $Q_R$. This would indicate that pointer 16 would read upscale by the same number of degrees from the zero position as vector $Q_R$ is rotated from the zero axis.

FIG. 8 indicates a different position of the resultant flux vector $Q_R$ pursuant to cosine signal amplitude $-X_2$ and sine coil of magnitude $Y_2$. Note that vectors $Q_Z$ and $Q_C$ are equal and opposite in direction, as they were in FIG. 7, so that again, return-to-zero magnets 37 and compensating coil 41 exactly offset each other and do not in any way affect the position of rotor 23.

By choosing appropriate materials for various elements of the meter movement, the return-to-zero function of the meter may also be temperature compensated. The strength of ferrite magnets 37 is not stable with temperature. The strength of the magnetic field provided by these magnets decreases substantially linearly with increase in temperature. However, as temperature increases, the resistance of copper wire also increases. Thus, as the magnetic strength of the permanent magnets goes down, the current through compensating coil 41 also decreases substantially linearly. It would normally be expected that the rate of change of magnetic strength of magnets 37 would differ somewhat from the rate of change of resistance in the copper wire. For this reason, resistor 51 is connected in series with compensating coil 41, the ohmic value of which is chosen so that the effect of the compensating coil substantially balances the effect of the return-to-zero magnets over a relatively wide range of temperatures in which the meter might be required to operate. The resistance of resistor 51 is substantially independent of temperature changes.

In view of the above description, it is likely that modifications and improvements will occur to those skilled in this art which are within the scope of this invention.

What is claimed is:

1. An electrical indicator having an indicator pointer and means for angularly displacing said pointer in response to variations in the magnitude of an external electrical signal, said indicator comprising:
   a rotor retaining said indicator pointer and being magnetized to provide opposite magnetic poles;
   means for rotatably mounting said rotor and said indicator pointer;
   permanent magnet means for establishing a first magnetic flux passing through said rotor substantially perpendicular to the axis thereof and urging said rotor to an equilibrium position;
   first coil means oriented in relation to said permanent magnet means such that on passage of a predetermined current therethrough, an independent second magnetic flux is established for substantially cancelling said first magnetic flux;
   second coil means responsive to said external electrical signal and oriented to establish a third flux disposed at an angle representative of said external signal magnitude;
   wherein said rotor and indicator pointer rotate from said equilibrium position to a position at said angle of said flux of said second coil means when both first and second coil means are energized as aforesaid and said rotor and said pointer return to said equilibrium position pursuant established by the flux of said permanent magnet means when said first and second coil means are not energized.

2. An electrical indicator as in claim 1, wherein:
   said first coil means comprises a first coil disposed about said rotor and said permanent magnet means; the axis of the magnetic flux established by said first coil when energized being substantially coincident with the axis of the magnetic flux of said permanent magnet means.

3. An electrical indicator as in claim 2, wherein:

said second coil means comprises second and third orthogonal coils disposed about said rotor and being both responsive to said external electrical signal;

said third flux being the resultant of the respective magnetic fluxes of said orthogonal second and third coils.

4. An electrical indicator as in claim 3, wherein:

said permanent magnet means for establishing said first magnetic flux comprises a pair of permanent magnets disposed in the plane of rotation of said rotor on opposite sides of the rotational axis thereof.

5. An electrical indicator as in claim 4, wherein:

said first coil is disposed in alignment with one of said second and third orthogonal coils.

6. An electrical indicator as in claim 5, which further includes:

a stable DC voltage source for energizing said first coil with said predetermined current for establishing said second magnetic flux for substantially cancelling said first magnetic flux.

7. An electrical indicator as in claim 6 which further includes:

a function generator adapted to convert said external signal to a pair of signals for application, respectively, to said second and third orthogonal coils.

8. An electrical indicator for angularly displacing an indicator pointer in response to variations in the magnitude of an external electrical signal source, said indicator comprising:

a bobbin formed with a central housing having a cavity therein;

a rotor within said cavity, said rotor being radially magnetized to provide opposite magnetic poles;

a shaft mounted to the axis of said rotor and extending outwardly from said cavity;

means for rotatably mounting said rotor and said shaft to said bobbin;

permanent magnet means on either side of said housing, arranged diametrically with respect to said rotor, the axis of the flux resulting from said magnets passing through said rotor perpendicular to the axis thereof and oriented in a first predetermined direction and urging said rotor to an equilibrium position;

a first coil on said bobbin comprising a multiplicity of turns of conductive wire, said first coil being oriented so that, when current passes therethrough, a flux is created through said rotor having an axis in alignment with the axis of the flux produced by said permanent magnets;

a second coil on said bobbin comprising a multiplicity of turns of conductive wire, said second coil being oriented so that, when current passes therethrough, a flux is created through said rotor having an axis displaced 90° from the axis of the flux produced by said first coil;

means adapted for connecting said first and second coils to a DC voltage source;

means adapted for coupling said first and second coils to a source of external signals; and a third coil on said bobbin comprising a multiplicity of turns of conductive wire, said third coil being adapted to be coupled to said DC voltage source and being oriented in alignment with said first coil, the axis of the flux produced by said third coil being in alignment with and opposite in direction to the flux produced by said permanent magnets;

wherein when said DC voltage source is selectably connected to said third coil, a flux is produced thereby which is opposite to said first predetermined direction and equal in magnitude to the flux produced by said permanent magnets; and wherein said pointer is selectively moved from said equilibrium position pursuant to the resultant flux when a signal is applied to said first and second coils and said pointer returns to said equilibrium position responsive to the flux of said permanent magnets when there is no signal on said first and second coils and no DC voltage source connected to said third coil.

9. The electrical indicator set forth in claim 8 wherein said permanent magnet means comprises two discrete magnets on either side of said housing on the center line of said rotor.

10. The electrical indicator set forth in claim 9 wherein:

said third coil is comprised of turns of wire having an impedance which varies directly with temperature;

the magnetic field strength of said permanent magnet means varies inversely with temperature;

a resistor connected in series with said third coil; and whereby the combined impedance of said third coil and said resistor varies with temperature such that the flux of said third coil substantially nulls the effect on said rotor of the flux of said permanent magnet means substantially independently of temperature.

11. The electrical indicator as in claim 9 wherein said coupling means comprises a function generator adapted to be connected to a source of external signals, said function generator converting said external signals into appropriate signals coupled to said first and second coils for deflection of said rotor from said equilibrium position.

12. An electrical indicator having a pointer and means for angularly displacing said pointer in response to variations in the magnitude of an external electrical signal, said indicator comprising:

a rotor retaining said indicator pointer and being magnetized to provide radially opposite magnetic poles;

means for rotatably mounting said rotor and said indicator pointer;

permanent magnet means for establishing a first magnetic flux passing through said rotor substantially perpendicular to the axis thereof and urging said rotor to an equilibrium position;

means for compensating the first flux generated by said permanent magnet means, wherein the urging to an equilibrium position of said rotor by said first magnetic flux is cancelled;

a first and a second coil means responsive to said external electrical signal and oriented to establish a rotatable flux disposed at an angle representative of said external signal magnitude, wherein:

said means for compensating is selectively operative to alter the flux created along the axis of at least one of said first and second coil means;

said rotor and pointer rotate from said equilibrium position to a position at said angle of said rotatable flux when at least one of said first and second coil means are energized as aforesaid; and wherein said rotor and said pointer return to said equilbrium position established by said first flux of said permanent magnet means when said means for compensating is inoperative and said first and second coil means are not energized.

13. The electrical indicator of claim 12, wherein said means for compensating comprises means to cancel the flux generated by said permanent magnet means.

14. A method of angularly displacing a pointer of an electrical indicator in response to the magnitude of an external electrical signal, comprising the steps of:

rotatably mounting a magnetized rotor having radially opposed magnetic poles;

establishing a first magnetic flux passing through said rotor to engage said magnetized rotor to urge said rotor to an equilibrium position;

generating a rotatable flux oriented to an angle corresponding to the magnitude of said extend electrical signal;

compensating for the first magnetic flux when said rotatable flux is generated, wherein:

said rotor and said pointer rotate from said equilibrium position to coincide with said angle of said rotatable flux, and said step of compensating is operative while generating said rotatable flux, and inoperative when said rotatable flux is not generated.

* * * * *